United States Patent [19]
Tsunenari

[11] Patent Number: 5,660,528
[45] Date of Patent: Aug. 26, 1997

[54] LIQUID DELIVERY SYSTEM AT SPECIFIED RATE USING ULTRASONIC VIBRATORS

[75] Inventor: Kinji Tsunenari, Tokyo, Japan

[73] Assignee: NEC Corporation, Japan

[21] Appl. No.: 578,319

[22] Filed: Dec. 26, 1995

[30] Foreign Application Priority Data

Dec. 26, 1994 [JP] Japan .................................. 6-322662

[51] Int. Cl.$^6$ .................................................. F04B 49/06
[52] U.S. Cl. ............................................ 417/32; 417/52
[58] Field of Search ........................... 417/52, 207, 322, 417/413.2, 412, 43, 32

[56] References Cited

U.S. PATENT DOCUMENTS 5,465,468  11/1995  Manna .................................. 29/25.35

FOREIGN PATENT DOCUMENTS

0857544  8/1981  U.S.S.R. .................................. 417/412

*Primary Examiner*—Timothy S. Thorpe
*Assistant Examiner*—Cheryl J. Tyler
*Attorney, Agent, or Firm*—Hayes, Soloway, Hennessey, Grossman & Hage, P.C.

[57] ABSTRACT

A liquid delivery system is provided, which enables to deliver a liquid source material at a specified flow rate without contamination of the source material and blocking of the delivering channel. A liquid forwarding device is provided for forwarding a liquid source material. The device has a communication path communicating with the channel. An elastic outer tubular member and an elastic inner member form the communication path therebetween. The device has ultrasonic vibrators placed onto the outer wall of the outer member. The vibrators vibrates the outer member to generate a surface acoustic wave travelling along the inner wall of the outer member. The travelling wave forwards the material existing in the communicating path. The device is controlled by a forwarding rate controller to adjust a forwarding rate of the material existing in the communication path. A flow rate of the material is sensed by a flow rate sensor. The forwarding rate is adjusted by changing vibration of the vibrators. The liquid source material is delivered in the channel at the specified flow rate by adjusting the ultrasonic vibration.

11 Claims, 8 Drawing Sheets

LIQUID DELIVERY SYSTEM AT SPECIFIED RATE USING ULTRASONIC VIBRATORS

BACKGROUND OF THE INVENTION

1. Field of the Invention

The present invention relates to a liquid delivery system and more particularly, to a liquid delivery system for delivering a liquid source material at a specified rate to an equipment, which is preferably used for semiconductor device fabrication such as chemical vapor deposition (CVD) and dry etching.

2. Description of the Prior Art

Conventionally, when a source material in liquid form at ambient temperature is delivered to a CVD equipment at a specified flow rate, the following two delivering methods have been employed.

A first delivering method is advantageous to liquid source materials having a comparatively high vapor pressure such as titanium tetrachrolide ($TiCl_4$). In this method, a carrier gas such as an inert gas is injected into the liquid source material stored in a container for bubbling, thereby producing a vapor of the liquid source material contained in the carrier gas. Then, the carrier gas containing the source the equipment through transferring ducts or channels.

Thus, the liquid source material is bubbled ad then, it is transported or delivered to the chamber together with the carrier gas. The first delivering method has been practically used most popularly because of its easiness.

A second delivering method is advantageous to liquid source materials having a low vapor pressure such as tetrakis-diethylamino-titanium $Ti[N(C_2H_5)_2]_4$, because these source materials cannot be delivered at a desired flow rate by the bubbling technique. In this method, the source material is metered in liquid form with a mass flow controller, a metering pump or the like and then, it is transported to a vaporizer. The liquid source material thus transported is vaporized in the vaporizer and is delivered to a reaction chamber of the CVD equipment through delivering channels.

Thus, the liquid source material is metered in liquid form without the bubbling process and it is transported to the vaporizer placed on the upstream-side of the CVD chamber. No carrier gas is required.

The mass flow controller used in the second delivering method, which is designed for liquids, has a similar configuration to popular mass flow controllers designed for gasses. Specifically, the controller designed for liquids has a flow rate sensor placed in a capillary of the main delivering channel, a conductance-variable valve which is capable of high-speed response, and an electronic control system for controlling the flow rate of the source material in the main channel. The flow rate of the liquid source material is always monitored by the sensor. The conductance of the valve varies in response to the output signal from the sensor under the feed-back control by the control system, thereby keeping the flow rate of the source material at a specified delivering rate.

Figure 1:
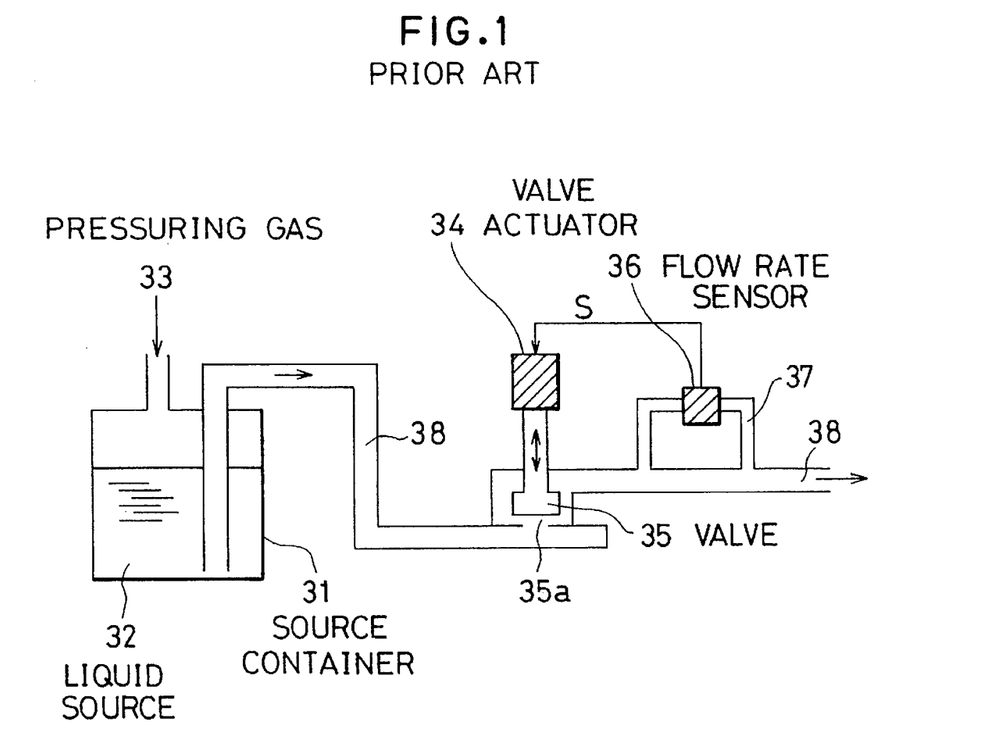
FIG. 1 is a schematic diagram of a conventional liquid delivery system for delivering a liquid source material to a CVD equipment at a specified rate.

FIG. 1 shows a conventional liquid delivery system for delivering a liquid source material at a specified rate to a CVD equipment, which has been usually employed for performing the above second delivering method.

As shown in FIG. 1, this delivery system includes a conductance-variable valve 35 capable of high-speed response, a valve actuator 34 for driving the valve 35, and a flow rate sensor 36 for sensing the flow rate of a liquid source material 32 which is in liquid form at ambient temperature.

The liquid source material 32 is stored in a source container 31. To apply a specified pressure to the source 32A, a pressurizing gas 33 such as an inert gas is supplied to the container 31. A main duct or channel 38, which is made of metal or plastic tubes, is provided so that the container 31 communicates with an inlet of a CVD equipment.

A metering pump (not shown) is provided at the main channel 38 to transfer the material 32 to the chamber.

The conductance-variable valve 35 is placed on the main channel 38 midway between the container 31 and the deposition chamber. The valve 35 forms a variable orifice 35a in the channel 38. The size of the orifice 35a, that is, the conductance of the valve 35, varies under the feedback control by the valve actuator 34.

The flow rate sensor 36 also is placed at the main channel 38 midway between the container 31 and the deposition chamber. A bypass 37 is formed by a capillary at the main channel 38 on the downstream side of the valve 35. The sensor 36 is provided at the bypass 37, and it senses the flow rate of the liquid source material 32 flowing through the bypass 37 to output an electric signal S to the valve actuator 34. In response to the received signal S, the actuator 36 actuates the valve 35 to change its conductance, thereby delivering the source material 32 to the deposition chamber at a specified, constant flow rate.

The conventional liquid delivery system shown in FIG. 1 has the following problems.

First, the conventional system inherently requires a difference between the liquid pressures at the inlet and outlet of the valve 35, since the conventional system employs the conductance-variable valve 35. To produce this pressure difference, the pressuring gas 33 is supplied to the source container 31 for pressuring the source material 32. This is very popular.

However, the pressuring gas 33 tends to be dissolved in the source material 32, and the dissolved gas 33 tends to become bubbles within the main channel 38. As a result, a first problem that a large or serious error tends to be caused by the sensor 36 in sensing the flow rate and that the main channel 38 and/or the bypass 37 is blocked or choked.

Second, since the movable element or part of the valve 35 (for example, a piston) is typically made of metal or plastic, there is a possibility that the element generates dust. The dust has a tendency to induce contamination of the source material 32.

Third, although the liquid source material 32 flows in the form of laminar flow through the bypass 37 made of the capillary, the flowing velocity of the material 32 is approximately zero (0) in the vicinity of the inner wall of the bypass 37. Therefore, contamination tends to deposited or accumulated on the inner wall, which leads to block of the bypass 37 also.

When the metering pump is of the reciprocating type, the following fourth to sixth problems additionally occur.

The fourth problem is that precise flow rate control is difficult, because flow rate pulsate of the source material 32 takes place due to the reciprocating motion.

The fifth problem is that the source material 32 tends to be contaminated by dusts that is generated by friction in reciprocating motion.

The sixth problem is that when the main channel 38 and/or bypass 37 is blocked, a possibility of damage or destruction of the pump occurs due to pressure rise, and that a firing danger of the source material 32 occurs.

SUMMARY OF THE INVENTION

Accordingly, an object of the present invention is to provide a liquid delivery system that enables to deliver a liquid source material at a specified flow rate without contamination of the source material and blocking of the delivering channel.

Another object of the present invention is to provide a liquid delivery system that can control precisely the flow rate of a liquid source material.

Still another object of the present invention is to provide a liquid delivery system that can deliver a liquid source material at a minute flow rate.

These objects together with others not specifically mentioned will become clear to those skilled in the art from the following description.

A liquid delivery system according to the present invention includes a liquid forwarding device for forwarding a liquid source material. The device has a communication path and is placed in a channel to communicate with the channel.

Also, the device has an elastic outer tubular member with a cylindrical inner wall and a cylindrical outer wall, an elastic inner member with a cylindrical outer wall placed in said outer member. The outer and inner members form the communication path therebetween.

The outer and inner members may be made of any elastic material if the liquid forwarding effect can be realized.

The device further has ultrasonic vibrators placed onto the outer wall of the outer member. Each of the ultrasonic vibrators vibrates the outer member to generate a surface acoustic wave travelling along the inner wall of the outer member. The travelling wave forwards the material existing in the communicating path in a direction.

The system further includes a forwarding rate controller for controlling the liquid forwarding device to adjust a forwarding rate of the material existing in said communication path, and a flow rate sensor for sensing a flow rate of said material in said channel.

In the forwarding rate controller, the forwarding rate of the material is adjusted by changing vibration of the ultrasonic vibrators.

In the flow rate sensor, the sensor is placed in the channel on the downstream side of the liquid forwarding device. The sensor outputs an output signal to the forwarding rate controller, thereby adjusting the forwarding rate of the material existing in the communication path. The output signal is produced based on a sensing result of the flow rate of the material.

Thus, the liquid source material is delivered in the channel at the specified flow rate by adjusting the ultrasonic vibration.

The size (or cross section) of the communication path may be set corresponding to a wanted value of the flow rate.

With the liquid delivery system according to the present invention, the liquid forwarding device has a communication path formed by the elastic outer tubular member and the elastic inner member placed in the outer member.

Also, the ultrasonic vibrators placed onto the outer wall of the outer member vibrate the outer member to generate a surface acoustic wave travelling along the inner wall of the outer member, thereby forwarding the material existing in the communicating path in a direction by the travelling wave.

Accordingly, the liquid delivery system according to the invention enables to deliver a liquid source material at a specified flow rate without contamination of the source material and blocking of the delivering channel.

Also, the forwarding action is generated by the travelling surface acoustic wave. Therefore, by controlling or adjusting the applied ultrasonic vibration adaptively, the flow rate of the liquid source material can be controlled precisely. Additionally, the liquid source material can be delivered at a minute flow rate.

In a preferred embodiment, the inner member of the liquid forwarding device is made of an elastic bar.

The inner member may be made of an elastic tubular element having an opening therein. In this case, the opening is preferably filled with an elastic material not to form another communication path that communicates with the channel.

The case where the inner member of the liquid forwarding device is made of an elastic bar is more preferable than the case where it is made of an elastic tubular element having an opening therein. The reason is that a higher delivery rate is obtained in the former case than the latter case.

In another preferred embodiment, the inner wall of the outer member is roughened by a roughening process. In this case, the forwarding rate of the material by the liquid forwarding device is increased due to the roughened inner wall, because more friction action takes place between the inner wall and the liquid source material contacted therewith.

The inner wall of the outer member may be smooth and no roughening process is applied onto the inner wall.

In a still another embodiment, one of the ultrasonic vibrator serves as a vibration source and another thereof serves as a vibration sink. In this case, an advantage that the travelling direction of the surface acoustic wave is kept in one direction occurs.

It is preferred that an applied voltage to one of the ultrasonic vibrators is different in phase from the remaining vibrators. An additional advantage that the functions as the vibration source and vibration sink are readily obtained.

The liquid delivery system according to the present invention can be applied any technical field. However, it is preferably applied to semiconductor device fabrication such as CVD, dry etching or the like.

In the present invention, the wording "a liquid source material" means a source material which is in liquid form at ambient temperature.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described in detail below while referring to FIGS. 2 to 8.

FIRST EMBODIMENT

Figure 2:
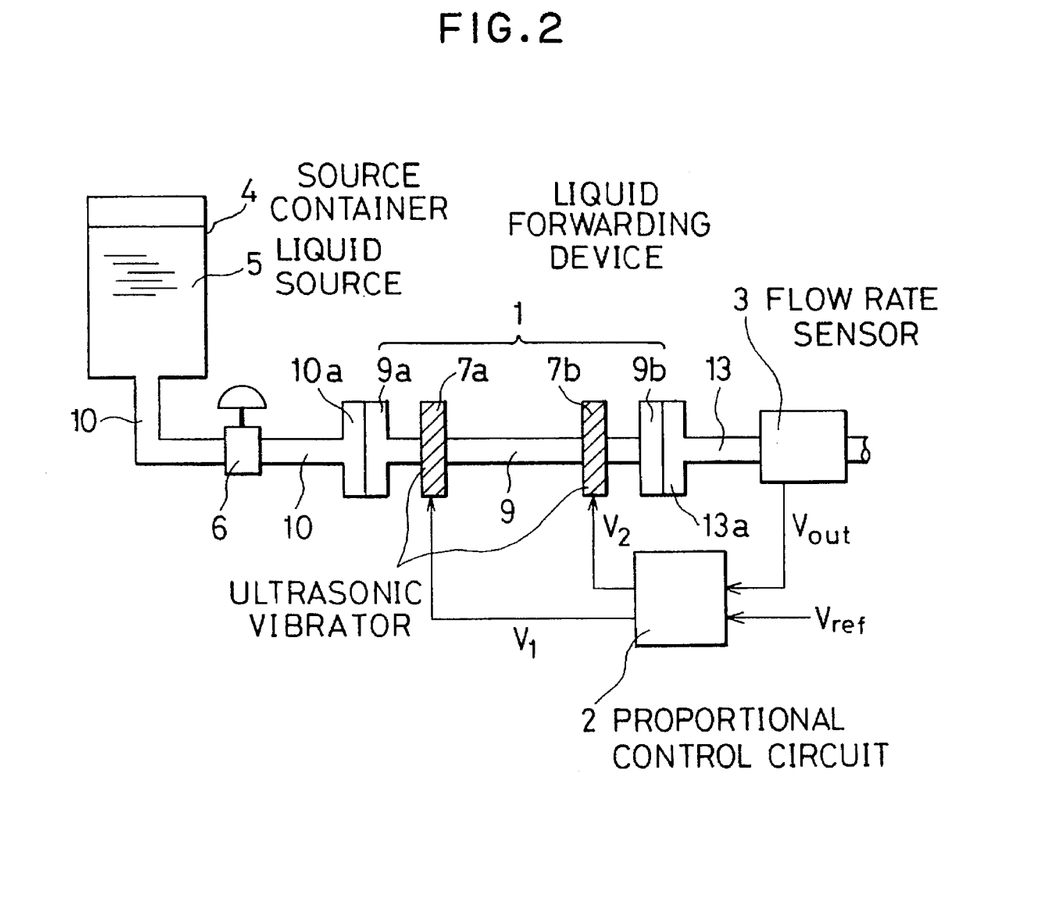
FIG. 2 is a schematic diagram of a liquid delivery system for delivering a liquid source material to a CVD equipment at a specified rate according to a first embodiment of the invention.
Figure 3:
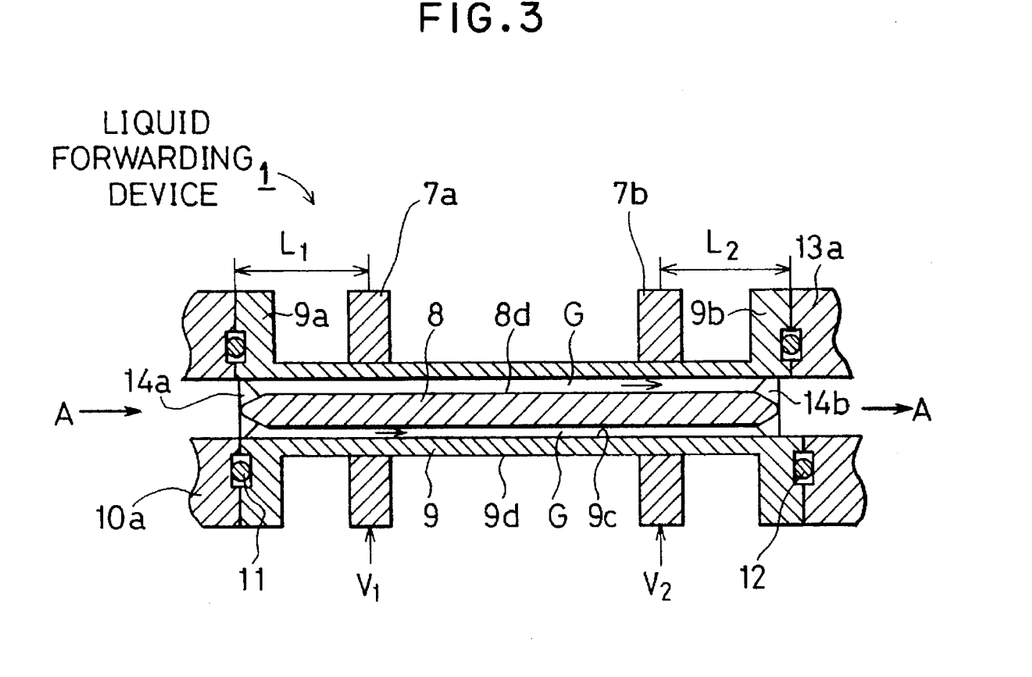
FIG. 3 is an enlarged, partial cross-sectional view of the liquid forwarding device in the liquid delivery system according to the first embodiment.

In FIGS. 2 and 3, a liquid delivery system according to a first embodiment is designed for delivering a liquid source material at a specified rate, which is configured for the above second delivering method.

As shown in FIG. 2, a liquid forwarding device 1 is provided for forwarding a liquid source material 5. A proportional control circuit 2 is placed to control the device 1 to keep the material 5 to flow at a specified, constant flow rate. A flow rate sensor 3 is placed to sense the flow rate of the flowing material 5, thereby monitoring the flow rate.

The liquid source material 5 is stored in a source container 4. One end of a main duct or channel 10 (disposed on the upstream side) is connected to the container 4, and the other end is connected to a corresponding end of the liquid forwarding device 1. One end of another main duct or channel 13 (disposed on the downwstream side) is connected to another corresponding end of the device 1. The other end of the channel 13 is connected to an inlet of an equipment to which the liquid source material 5 is delivered. The main channels 10 and 13 are usually made of metal or plastic tubes.

An outlet valve 6 is fixed in the main channel 10 midway between the container 4 and the liquid forwarding device 1. The stored material 4 in the container 4 is transferred to the device 1 through the valve 6 only when the valve 6 is open. If the valve 6 is closed, the material 4 is not transferred.

In the liquid delivery system according to the first embodiment, no pressuring gas is usually necessary for the container 4, which is different from the conventional liquid delivery system of FIG. 1. Even if any pressure is necessary to be applied to the stored material 5, a pressure generated by gravity, that is, a pressure produced by using the dead weight of the stored material 5, is sufficient for this purpose.

Figure 4:
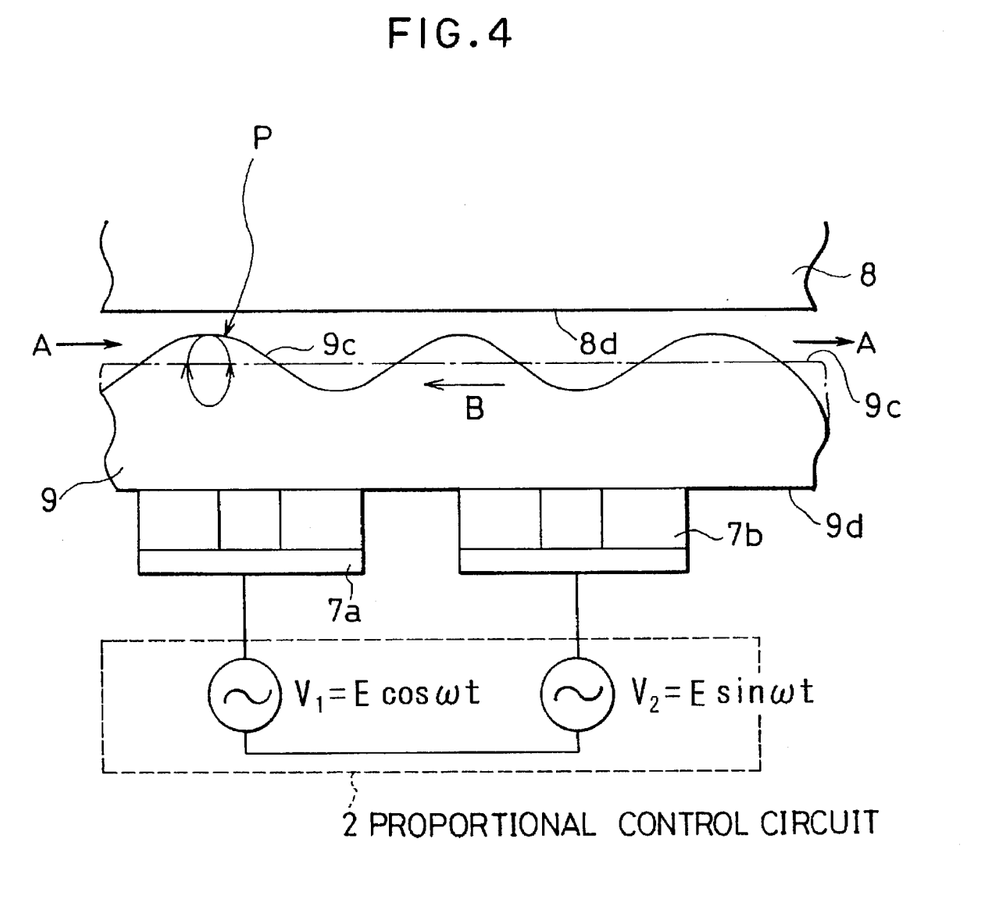
FIG. 4 is a enlarged schematic diagram showing the forwarding principle of the liquid forwarding device of the liquid delivery system according to the first embodiment.

The detailed structure of the liquid forwarding device 1 is shown in FIGS. 3 and 4. The liquid forwarding device 1 has an elastic inner member 8 with a solid cylindrical shape, and an elastic outer tubular member 9 with a hollow cylindrical shape. The inner member 8 has a cylindrical outer wall 8d. The outer member 9 has a cylindrical inner wall 8c and a cylindrical outer wall 9d.

The inner member 8 (which is made of a metal bar) is fixed within the outer member 9 (which is made of a metal tube) by spacers 14a and 14b so as to be concentric with the outer member 9. The spacers 14a and 14b are fixed onto the inner wall 9c of the outer member 9, and support the inner member 8 at each end thereof. Each of the spacers 14a and 14b has penetrating holes that allow the liquid source material 5 to flow through the spacers 14a and 14b.

The inner wall 9c of the outer member 9 is larger in diameter than the opposing outer wall 8d of the inner member 8. In other words, the inner wall 9c is apart from the opposing outer wall 8d over the entire length. Therefore, a gap G is formed between the walls 9c and 8d in the outer member 9. The gap G has a circular-ringed cross section. Since the inner member 8 has approximately the same length as that of the outer member 9, the gap G extends from one end of the member 9 to the other end thereof.

The gap G serves as a communication path for the liquid source material 5 and consequently, the material 5 transferred to the upstream-side end of the liquid forwarding device 1 can flow through the path G to the downstream-side end of the device 1. The material 5 flowing through the path G is forwarded by a surface acoustic wave induced by ultrasonic vibration according to the principle that will be explained below.

The outer member 9 further has flanges 9a and 9b at each end thereof. The flanges 9a and 9b have depressions where O-rings 11 and 12 are placed therein. The main channel 10 has a flange 10a at its corresponding end to the liquid forwarding device 1. The main channel 13 has a flange 13a at its corresponding end to the liquid forwarding device 1. The flanges 10a and 13a have depressions where the O-rings 11 and 12 are placed therein.

For example, the outer member 9 is made of a cylindrical tube of a nickel alloy, and the inner member 8 is made of a cylindrical bar of a nickel alloy. The members 9 and 8 have the same total length of 12 cm.

The inner member 8 has the outer wall 8d with a diameter of 5 mm. The outer member 9 has the inner wall 9c with a diameter of 5.1 mm. Therefore, the gap or communication path G has a circular-ringed cross section whose width is 0.05 mm. The outer wall 8d of the inner member 8 and the inner wall 9c of the outer member 9, which are contacted with the liquid source material 5, are smooth through an electro polishing process.

The opposing flanges 9a and 10a are tightly coupled together, and the opposing flanges 9b and 13a also are tightly coupled together. Thus, the liquid forwarding device 1 is fixed in the main channels 10 and 13.

The O-rings 11 and 12 are placed in the respective ring-shaped spaces, each of which is made of the two opposing depressions. The O-rings 11 and 12 provides sealing effect against the liquid source material 5.

The liquid forwarding device 1 further contains two ultrasonic vibrators 7a and 7b fixed apart from each other onto the outer wall 9d of the outer member 9. A distance from the center of the vibrator 7a to the outer end face of the flange 9a is $L_1$. A distance from the center of the vibrator 7b to the outer end face of the flange 9b is $L_2$. Each of the vibrators 7a and 7b has a circular-ringed shape.

Each of the vibrators 7a and 7b excites by vibration a surface acoustic wave (SAW) on the inner wall 9c of the outer member 9. The wave travels along the wall 9c or the communication path G. The liquid source material 5 existing in the path G is forwarded or transferred by the travelling wave along the inner wall 9c from one end of the path G to the other end thereof.

Each of the vibrators 7a and 7b is a typical Langevin transducer. The distance $L_1$ and $L_2$ are equal to a quarter of the wavelength $\lambda$ of the surface acoustic wave, i.e., $(\frac{1}{4})\lambda$. This placement is taken because the connection points of the outer member 9 to the main channels 10 and 13 should be joint points of the wave and therefore, the amplitude of the wave needs to be zero (0) at the points.

In this embodiment, the frequency of the driving voltage $V_1$ and $V_2$ is 50 kHz. Therefore, the wavelength $\lambda$ is approximately 6 cm, and the distances $L_1$ and $L_2$ are approximately 1.5 cm. The phase difference between the voltage $V_1$ and $V_2$ is approximately 180° in order to induce the travelling wave.

Although two ultrasonic vibrators 7a and 7b are provided in this embodiment, it is needless to say that three or more ultrasonic vibrators may be provided. In this case, if any phase difference is given to the respective driving voltages for the vibrators, the amplitude evenness of the travelling wave can be improved, which enables the more stable forwarding action.

As shown in FIG. 2, the flow rate sensor 3, which is placed on the downstream side of the liquid forwarding device 1, senses the flow rate of the liquid source material 5 flowing through the main channel 13. Based on the sensing result, the sensor 3 generates an output signal voltage $V_{out}$ and sends it to the proportional control circuit 2. The output signal voltage $V_{out}$ is proportional to the value of the sensed flow rate.

On the other hand, a reference signal voltage $V_{ref}$ is applied to the control circuit 2. The voltage $V_{ref}$ corresponds to the value of a desired flow rate.

The control circuit 2 receives the signal voltages $V_{ref}$ and $V_{out}$, and supplies driving voltages $V_1$ and $V_2$ to the respective ultrasonic vibrators 7a and 7b in response to the values of the voltages $V_{ref}$ and $V_{out}$. Each of the signal voltages $V_{ref}$ and $V_{out}$ varies dependent upon the difference between $V_{ref}$ and $V_{out}$ to adjust the flow rate of the source material 5 at the specified value.

Next, the principle through which the liquid source material 5 existing in the communication path or gap G is forwarded is explained referring to FIG. 4.

In FIG. 4, when ultrasonic vibration is applied to the outer member 9 of the liquid forwarding device 1 by the ultrasonic vibrators 7a and 7b, the vibration is transferred to the member 9 through the contact points of the vibrators 7a and 7b with the outer wall 9d. Due to the vibration, a surface acoustic wave occurs to travel from the contact points along the wall 9c.

The vibrators 7a and 7b apply the vibration whose vibrating direction is perpendicular to the outer wall 9d. the point P on the inner wall 9c, which is not directly applied with the vibration and apart from the contact points, is vibrated by the applied ultrasonic vibration, and as a result, the point P will move along an ellipsoidal orbit, as shown in FIG. 4. The other points on the wall 9c move along the same orbit.

Due to friction between the inner wall 9c and the liquid source material 5, the material 5 is moved along the ellipsoidal orbit. However, such the motion takes place over the entire inner walls 9c, and therefore, the material 5 itself is entirely transferred in the direction along an arrow A. In other words, because the surface acoustic wave excited on the inner wall 9c has moving crests in its waveform along the arrow A, the material 5 contacted with the crests are transferred in the same direction together with the movement of the crests.

The forwarding or transferring rate of the material 5 can be adjusted by changing the driving power for the vibrators 7a and 7b.

In this embodiment, one of the vibrators 7a and 7b serves as a vibration source and the other serves as a vibration sink in order to keep a single travelling direction of the wave. The driving voltage $V_1$ and $V_2$ are set as $V_1 = E \cos\omega t$, and $V_2 = E \sin\omega t$.

Figure 5:
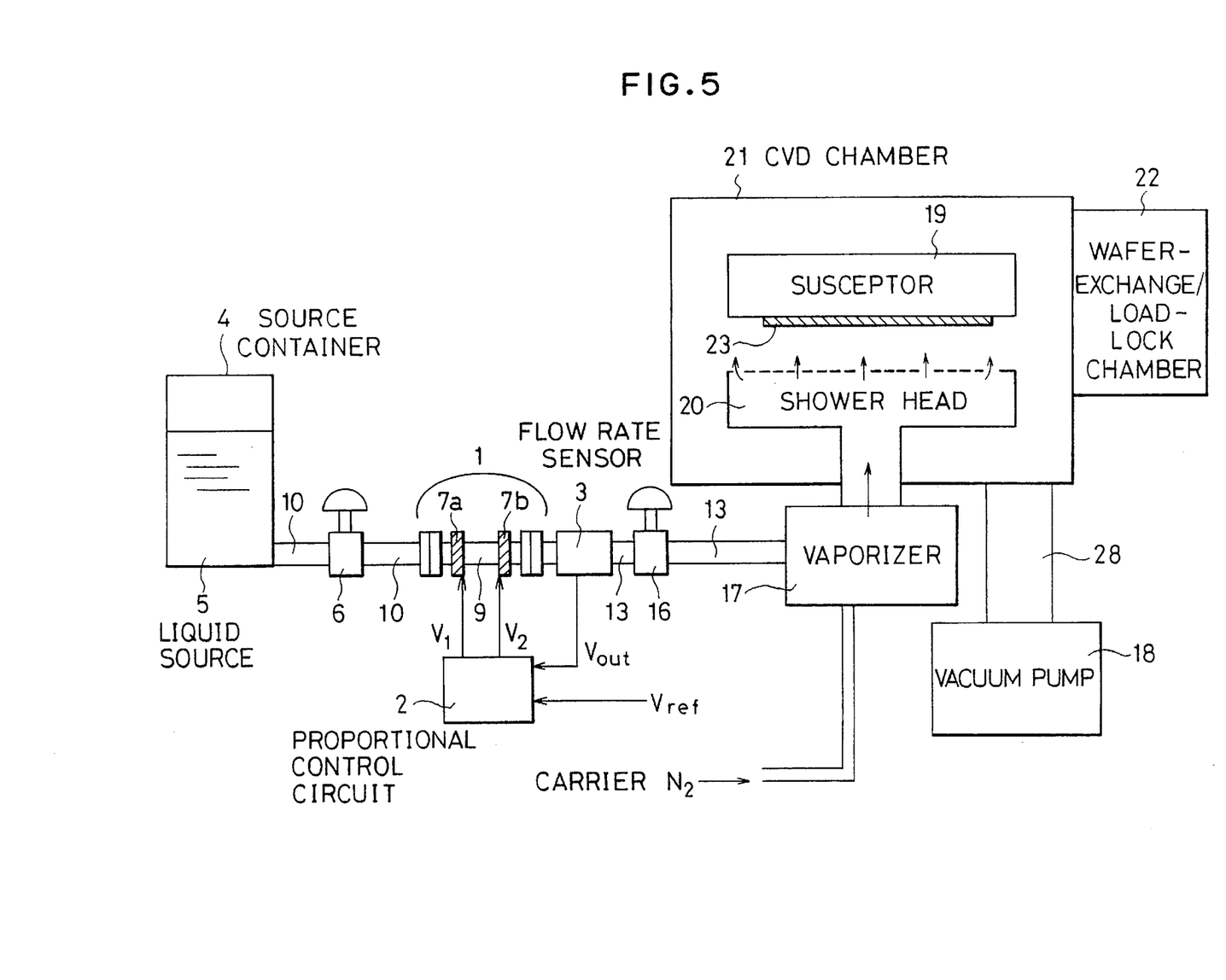
FIG. 5 is a schematic diagram of a CVD equipment, which employs the liquid delivery system according to the first embodiment.

FIG. 5 shows the entire CVD system using the liquid delivery system according to the first embodiment. In FIG. 5, a valve 16 is fixed in the main channel 13 between the flow rate sensor 3 and a vaporizer 17. The liquid source material 5 is delivered to the vaporizer 17 placed near the CVD chamber 21. A shower head 20 and a susceptor 19 is fixed within the chamber 21. A semiconductor substrate or wafer 23 is held by the susceptor 19 onto its lower surface.

Nitrogen ($N_2$) is injected into the vaporizer 17 as a carrier gas to vaporize the material 5 within the vaporizer 17. The vaporized source material 5, i.e., the vapor of the material 5, is supplied into the shower head 20, and is then emitted from the apertures of the head 20 toward the wafer 23.

The CVD chamber 21 is pumped by a vacuum pump 18 through an exhausting duct or tube 28. A wafer-exchange/load-lock chamber 22 is provided to be united with the chamber 21.

Figure 6:
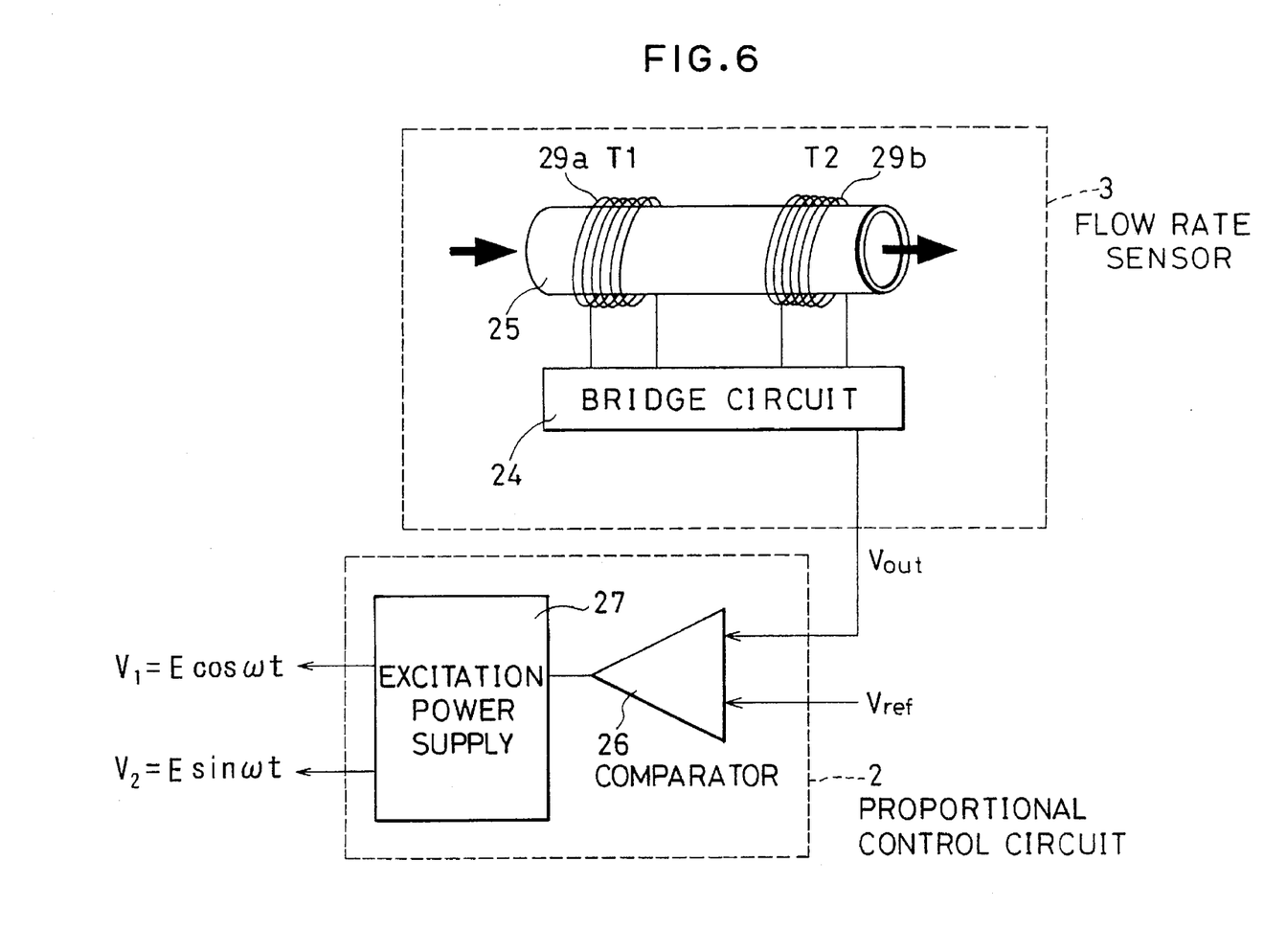
FIG. 6 is a partial schematic diagram of the flow rate sensor and the proportional control circuit used in the liquid delivery system according to the first embodiment.

FIG. 6 shows the detailed structure of the proportional control circuit 2 the flow rate sensor 3.

As shown in FIG. 6, the sensor 3 has the same structure as that used for a popular mass flow controller. Specifically, a bypass (not shown) and a capillary 25 are provided in the main channel 13. The liquid source material 5 flows through the bypass and capillary 25. Two heaters 29a and 29b are wound onto the capillary 25 apart from each other. The heaters 29a and 29b are used to detect the temperatures T1 and T2 at the wound points.

When no liquid flows through the capillary 25, T1=T2. If any liquid flows through the capillary 25, T1≠T2 due to that transfer induced by the liquid. Then, the temperature change or difference is detected by a bridge circuit 24. The circuit 24 generates the output signal voltage $V_{out}$ proportional to the detected flow rate and sends it to a comparator 26 in the control circuit 2.

The reference voltage $V_{ref}$ is applied to the comparator 26 together with the voltage $V_{out}$. The comparator 26 compares the values of $V_{ref}$ and $V_{out}$ and outputs a signal according to the comparison result to a power supply 27 for driving the ultrasonic vibrators 7a and 7b.

Thus, the voltages $V_1$ and $V_2$ or electric powers supplied to the vibrators 7a and 7 b are feedback-controlled to keep the flow rate of the liquid source material 5 at a specified value.

With the liquid delivery system according to the first embodiment, the liquid forwarding device 1 has a communication path G formed by the elastic outer tubular member 9 and the elastic inner member 8 placed in the outer member 9.

Also, the ultrasonic vibrators 7a and 7b placed onto the outer wall 9d of the member 9 vibrate the member 9 to generate a surface acoustic wave travelling along the inner wall 9c of the member 9, thereby forwarding the liquid source material 5 existing in the communicating path G in a direction by the travelling wave.

Accordingly, the liquid delivery system according to the first embodiment enables to deliver the liquid source material 5 at a specified flow rate without contamination of the source material 5 and blocking of the delivering channel 10 and 13.

Also, the forwarding action is generated by the travelling surface acoustic wave. Therefore, by controlling or adjusting the applied ultrasonic vibration adaptively, the flow rate of the liquid source material 5 can be controlled precisely. Additionally, the material 5 can be delivered at a minute flow rate.

Practically, to confirm the effect or advantage of the invention, the inventor performed some tests. $Ti[N(C_2H_5)_2]_4$ as the liquid source material 5 was delivered using the liquid delivery system according to the first embodiment. As a result, the flow rate could be continuously changed from 0.001 to 0.01 microliters/min, which was the optimum range for a TiN film deposition process on 6-inch silicon wafer by a thermal CVD technique.

SECOND EMBODIMENT

Figure 7:
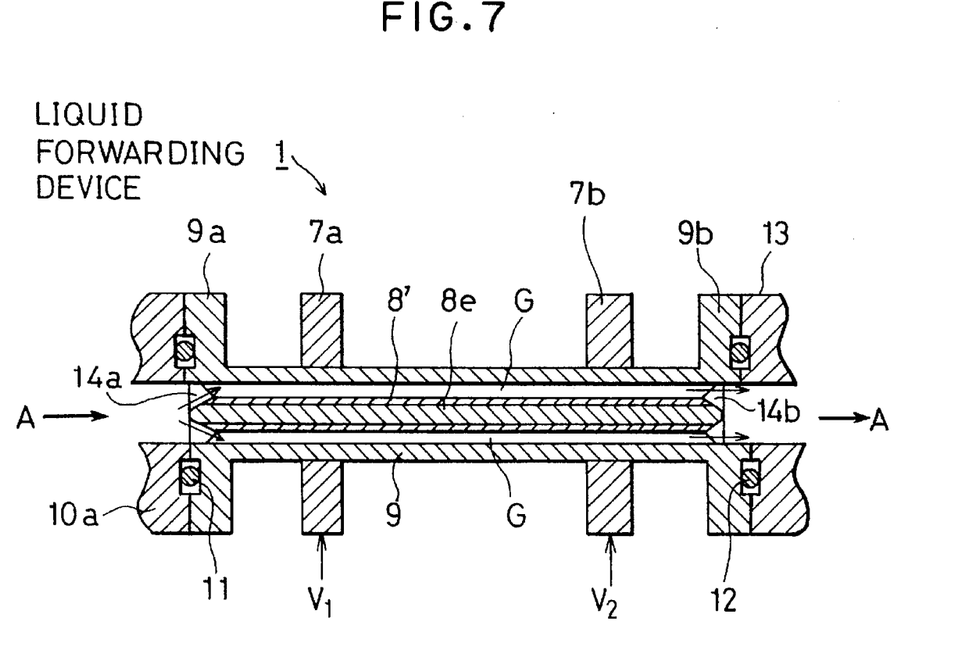
FIG. 7 is an enlarged, partial cross-sectional view of a liquid forwarding device in a liquid delivery system according to a second embodiment.

FIG. 7 shows a liquid delivery system 1' according to a second embodiment, which has the same structure as that of the first embodiment except that an inner member 8' is made of a metal tube having a penetrating hole therein. The hole is filled with an elastic material 8e.

Although the solid metal tube is used as the inner member 8 in the first embodiment, such the metal tube whose hole is filled with the elastic material 8e may be used in the invention.

In the second embodiment, the same effects or advantages as those in the first embodiment can be obtained. However, the delivery rate is less than that of the first embodiment due to the hole.

THIRD EMBODIMENT

Figure 8:
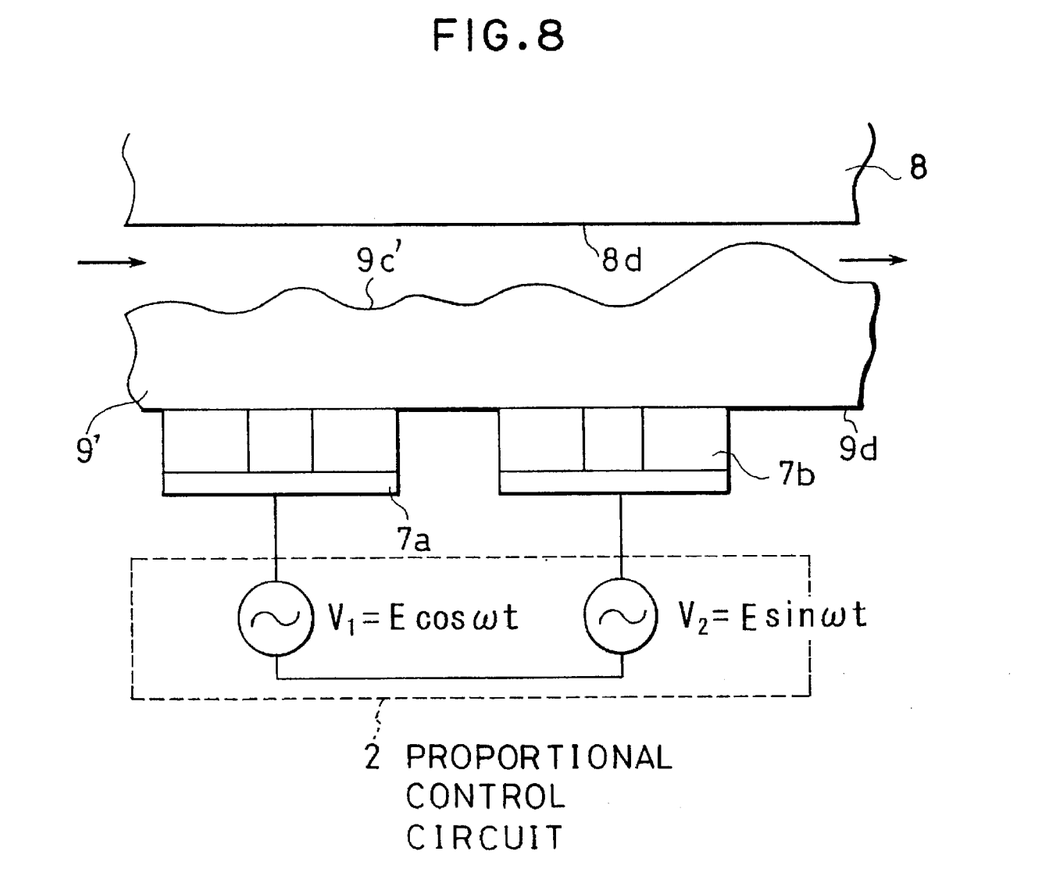
FIG. 8 is an enlarged, partial cross-sectional view of a liquid forwarding device in a liquid delivery system according to a third embodiment.

FIG. 8 partially shows a liquid delivery system according to a third embodiment, which is the same structure as that of the first embodiment except that an outer member 9' has a roughened inner wall 9c'.

Also in the third embodiment, the same effects or advantages as those in the first embodiment can be obtained.

Additionally, the friction of the wall 9c' with the source material 5 becomes greater than the first and second embodiments where the outer member 9 has a smooth inner wall 9c due to the roughened inner wall 9c. As a result, the delivery rate can be increased compared with the first and second embodiments.

In the above embodiments, the liquid delivery system is applied to a CVD equipment. However, the application fields of the invention is not limited to the CVD equipment. The invention may be applied to any other equipment for semiconductor device fabrication, and to any other field other than the semiconductor device fabrication.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A liquid delivery system for delivering a liquid source material in a channel at a specified flow rate, said system comprising:

(a) a liquid forwarding device for forwarding a liquid source material, said device having a communication path therein;

said device being placed in said channel so that said communication path communicates with said channel;

said device having an elastic outer tubular member with a cylindrical inner wall and a cylindrical outer wall, an elastic inner member with a cylindrical outer wall placed in said outer member;

said outer member and said inner member forming said communication path therebetween;

said device having ultrasonic vibrators placed onto said outer wall of said outer member;

each of said ultrasonic vibrators vibrating said outer member to generate a surface acoustic wave travelling along said inner wall of said outer member; and said travelling wave forwarding said material existing in said communicating path in a direction;

(b) a forwarding rate controller for controlling said liquid forwarding device to adjust a forwarding rate of said material existing in said communication path;

said forwarding rate of said material being adjusted by changing vibration of said ultrasonic vibrators; and (c) a flow rate sensor for sensing a flow rate of said material flowing in said channel;

said sensor being placed in said channel on the downstream side of said liquid forwarding device;

said sensor outputting an output signal to said forwarding rate controller, thereby adjusting said forwarding rate of said material existing in said communication path;

said output signal being produced based on a sensing result of said flow rate of said material;

wherein said liquid source material is delivered in said channel at said specified flow rate by adjusting said ultrasonic vibration.

2. A liquid delivery system as claimed in claim 1, wherein said inner member of said liquid forwarding device is made of an elastic bar.

3. A liquid delivery system as claimed in claim 1, wherein said inner member of said liquid forwarding device is made of an elastic tubular element having an opening therein;

and wherein said opening is filled with an elastic material.

4. A liquid delivery system as claimed in claim 1, wherein said inner wall of said outer member is smooth;

and wherein no roughening process is applied onto said inner wall.

5. A liquid delivery system as claimed in claim 1, wherein said inner member of said liquid forwarding device is made of an elastic bar, and said device has no other communication path than said communication path therein;

and wherein said inner wall of said outer member is smooth, and no roughening process is applied onto said inner wall.

6. A liquid delivery system as claimed in claim 1, wherein said inner member of said liquid forwarding device is made of an elastic tubular element having an opening therein, said opening being filled with an elastic material;

and wherein said inner wall of said outer member is smooth, and no roughening process is applied onto said inner wall.

7. A liquid delivery system as claimed in claim 1, wherein said inner wall of said outer member is roughened by a roughening process;

and wherein said forwarding rate of said material by said liquid forwarding device is increased due to said roughened inner wall.

8. A liquid delivery system as claimed in claim 1, wherein said inner member of said liquid forwarding device is made of an elastic bar;

and wherein said inner wall of said outer member is roughened by a roughening process;

and wherein said forwarding rate of said material by said liquid forwarding device is increased due to said roughened inner wall.

9. A liquid delivery system as claimed in claim 5, wherein said inner member of said liquid forwarding device is made of an elastic tubular element having an opening therein, said opening being filled with an elastic material;

and wherein said inner wall of said outer member is roughed by a roughening process;

and wherein said forwarding rate of said material by said liquid forwarding device is increase due to said roughened inner wall.

10. A liquid delivery system as claimed in claim 1, wherein one of said ultrasonic vibrators serves as a vibration source and another thereof serves as a vibration sink;

and whereby the travelling direction of said surface acoustic wave is kept in one direction.

11. A liquid delivery system as claimed in claim 1, wherein an applied voltage to one of said ultrasonic vibrators is different in phase from said remaining vibrators.

* * * * *

UNITED STATES PATENT AND TRADEMARK OFFICE
CERTIFICATE OF CORRECTION

PATENT NO.   : 5,660,528
DATED        : August 26, 1997
INVENTOR(S)  : KINJI TSUNENARI It is certified that error appears in the above-indentified patent and that said Letters Patent is hereby corrected as shown below:

Claim 9, Col. 11, line 7, "roughed" should be --roughened--

Signed and Sealed this

Twelfth Day of May, 1998

Attest:

Attesting Officer

BRUCE LEHMAN

Commissioner of Patents and Trademarks